US006529150B1

(12) United States Patent
Shoop et al.

(10) Patent No.: US 6,529,150 B1
(45) Date of Patent: Mar. 4, 2003

(54) PHOTONIC ANALOG TO DIGITAL CONVERSION BASED ON TEMPORAL AND SPATIAL OVERSAMPLING TECHNIQUES

(75) Inventors: Barry L. Shoop, West Point, NY (US); Pankaj Das, La Jolla, CA (US); Daniel Litynski, Kalamazoo, MI (US)

(73) Assignee: The United States of America has represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/606,119

(22) Filed: Jun. 15, 2000

Related U.S. Application Data

(60) Provisional application No. 60/142,808, filed on Jul. 8, 1999.

(51) Int. Cl.[7] .................................................. H03M 1/00
(52) U.S. Cl. ........................... 341/137; 341/13; 341/14; 341/31; 341/137; 341/143; 341/144; 341/151; 359/117; 359/138; 359/193; 359/238
(58) Field of Search ............................. 341/13, 14, 31, 341/137, 143, 144, 151; 359/117, 138, 193, 238

(56) References Cited

U.S. PATENT DOCUMENTS

| | | | | | |
|---|---|---|---|---|---|
| 4,770,483 A | * | 9/1988 | Ridgway | .................. | 350/96.13 |
| 4,831,376 A | * | 5/1989 | Reid et al. | ..................... | 341/13 |
| 4,851,840 A | * | 7/1989 | McAulay | .................... | 341/138 |
| 4,947,170 A | * | 8/1990 | Falk | ............................ | 341/137 |
| 5,264,849 A | * | 11/1993 | Kondoh | ...................... | 341/137 |
| 5,381,147 A | * | 1/1995 | Birkmayer | .................. | 341/137 |
| 5,450,223 A | * | 9/1995 | Wagner | ...................... | 359/124 |
| 5,565,867 A | * | 10/1996 | Tiemann | ..................... | 341/143 |
| 6,016,211 A | * | 1/2000 | Szymanski | .................. | 359/117 |
| 6,100,831 A | * | 8/2000 | Frankel | ...................... | 341/137 |
| 6,118,396 A | * | 9/2000 | Song | .......................... | 341/137 |
| 6,188,342 B1 | * | 2/2001 | Gallo | ......................... | 341/137 |

OTHER PUBLICATIONS

"A fully connected, distributed mesh feedback approach to photonic A/D conversion"; Shoop, B.L.; Das, P.K.; Talty, T.J.; Ressler, E.K.; Lasers and Electro–Optics, 2000. (CLEO 2000). Conference on , 2000; pp.: 491–492.*
"Photonic A/D converters"; Twichell, J.C.; Lasers and Electro–Optics, 1999. CLEO '99. Summaries of Papers Presented at the Conference on , 1999; pp.: 168.*
"Performance of a time–and wavelength–interleaved photonic sampler for analog–digital conversion"; Clark, T.R.; Kang, J.U.; Esman, R.D.; IEEE Photonics Technology Letters , vol.: 11 Issue: 9, Sep. 1999; pp. 1168–1170.*
A highly–parallel mismatch tolerant photonic A/D converter; Shoop, B.L.; Dudevoir, G.P.; Wagner, T.D.; Sadowski, R.W.; Ressler, E.K.; Das, P.K.; Lasers and Electro–Optics, 2001. CLEO '01. Technical Digest. Summaries of papers presented at the Conference on.*

* cited by examiner

Primary Examiner—Michael Tokar
Assistant Examiner—Khai Nguyen
(74) Attorney, Agent, or Firm—Paul S. Clohan, Jr.; William V. Adams

(57) ABSTRACT

A method of converting an analog signal to a digital signal includes (a) filtering the analog signal to the range $0 \leq f_x \leq f_B$; (b) sampling the filtered signal at a rate $f_S >> f_N$, where $f_S$ is the sampling frequency, $f_N = 2f_x$ is the Nyquist frequency of the sampled signal, and $f_B \leq f_S/2$ is the constrained signal bandwidth; (c) converting the sampled signal to an optical sampled signal; (d) converting the optical sampled signal from a temporal signal to a spatial signal; (e) illuminating a smart pixel array with the spatial signal; (f) processing the spatial signal with an error diffusion neural network to produce a 2-D binary image; and (g) averaging rows and columns of the 2-D binary image using a digital low pass filter and a decimation circuit.

14 Claims, 8 Drawing Sheets

PHOTONIC ANALOG TO DIGITAL CONVERSION BASED ON TEMPORAL AND SPATIAL OVERSAMPLING TECHNIQUES

RELATED APPLICATIONS

This application claims the benefit of priority of U.S. provisional patent application serial No. 60/142,808 filed Jul. 8, 1999. U.S. provisional patent application serial number 60/142,808 filed Jul. 8, 1999 is hereby expressly incorporated by reference.

STATEMENT OF GOVERNMENT INTEREST

The invention described herein may be manufactured and used by or for the Government of the United States of America for government purposes without the payment of any royalties therefor.

BACKGROUND OF THE INVENTION

The invention relates in general to analog-to-digital (A/D) converters and in particular to photonic analog-to-digital (A/D) converters.

The majority of the signals encountered in nature are analog while the preferred method of processing these signals is digital. Digital signal processors provide higher resolution, improved flexibility and functionality, and improved noise immunity over their analog counterparts. As a result, the A/D interface is generally considered to be the most critical part of, any signal acquisition and processing system. Because of the difficulty in achieving high-resolution and high-speed A/D converters, the A/D interface has been and continues to be a barrier to the realization of high-speed, high-throughput systems.

Electronic A/D techniques have been investigated but appear to be limited. ΣΔ techniques have been successful in providing high-resolution converters but only for audio frequency signals. Optical approaches have also been investigated to leverage the wide bandwidth and parallelism of optics but most have been limited by the component linearity, device speed, or dynamic range Over the past seven years, performance of electronic analog-to-digital (A/D) converters has improved by only one-bit for high-performance applications (See R. H. Walden, "Analog-to-digital converter technology comparison," Proc. GaAs IC Symposium, 217–219 (1994)). As a result, there has recently been a renewed interest in new and innovative approaches to A/D conversion, with a significant emphasis on photonic techniques. The potential advantages of using photonics technology come in the form of high-speed clocking, broadband sampling, reduced mutual interference of signals, and compatibility with existing photonic-based systems. Another advantage of processing signals in the optical domain is the parallelism obtained by performing signal processing in both space and time domains simultaneously. Photonic approaches to A/D conversion have been considered in the past with varying degrees of success. Some of the approaches employed Mach-Zehnder interferometers, others incorporated acoustooptic modulators, and recently multiple quantum well modulators have been incorporated into non-traditional architectures.

Probably the best known approach to A/D conversion using photonic techniques was developed by Taylor in 1975 (See H. F. Taylor, "An electrooptic analog-to-digital converter," Proc. IEEE 63, 1524–1525 (1975). He was the first to recognize that the periodicity of the output of an interferometric electrooptic modulator with applied field was homomorphic to the periodic variation of a binary representation of the applied field. A 4-bit implementation (See R. A. Becker, C. E. Woodward, F. J. Leonberger, and R. W. Williamson, "Wide-band electrooptic guided-wave analog-to-digital converter," Proc. IEEE 72, 802–819 (1984)) of this approach is shown in FIG. 1(a).

The basic optical component used in this architecture is a channel waveguide version of a Mach-Zehnder interferometric modulator. It is easily shown that the output intensity of a single interferometer varies as $$I = I(0)\cos^2\left(\frac{\phi}{2} + \frac{\varphi}{2}\right) \quad \text{with} \quad \phi = 2\pi\left(\frac{\Delta n}{\lambda}\right) = kLV \qquad (1)$$

where ($\varphi/2$ is the static phase difference between the two paths and $\phi/2$ is the electrooptic phase difference. Here, $\Delta n$ is the chance in refractive index, V is the applied voltage, L is the modulator length, and k is a constant which depends on the electrooptic parameters of the crystal, the electrode spacing, and optical wavelength.

In FIG. 1(a), the analog input signal V is applied in parallel to one arm of each of the four modulators, one for each bit of resolution. The optical output from each modulator is then detected by an avalanche photodiode. The signal from each modulator is then compared to a reference signal, obtained from the common light source. The output of each comparator is either a binary 1 or 0, depending on whether the modulator output intensity is greater than or less than $1(0)/2$, respectively. The output of the top modulator represents the least significant bit (LSB) in the digital word and that of the bottom modulator is the most significant bit (MSB). The output intensity threshold, and corresponding binary representation for each modulator are shown in FIG. 1(b).

This electrooptic A/D converter provides several distinct advantages including linear complexity and decoupling of the analog sampled signal from the optical sampling signal. A fundamental limitation is that each additional bit of resolution requires a doubling of the electrode length of the least significant bit modulator. In LiNbO$_3$, this produces a transit-time limitation on performance of approximately 6 bits at 1 GHz.

Other types of optical A/D converters have also been investigated, but with much less success than Taylor's electrooptic converter. Most were limited by speed, complexity, or resolution and therefore did not warrant further investigation. For example, Tsunoda proposed optical A/D conversion based on a matrix-multiplication formalism (See Y. Tsunoda and J. W. Goodman. "Combined optical A/D conversion and page composition for holographic memory applications," Appl. Optics 16, 2607–2609 (1977)). In this implementation, an astigmatic optical processor (See L. J. Cutrona, Optics and Electro-Optical Information Processing, ch. 6, Cambridge, Mass.: MIT Press (1965)) was used with the electronic analog input signal driving an optical beam deflector. This method of optical A/D conversion was limited by the speed capacity of the deflector, $C=K/\tau$, where K is the number of resolvable spots addressable and $\tau$ is the time required for random access to a specific location. Other approaches to the optical A/D conversion problem can also be found in the literature.

SUMMARY OF THE INVENTION

The present invention provides a method of converting an analog signal to a digital signal comprising (a) filtering the analog signal to the range $0 \leq f_x \leq f_B$; (b) sampling the filtered signal at a rate $f_B \gg f_N$, where $f_S$ is the sampling frequency, $f_N = 2f_x$ is the Nyquist frequency of the sampled signal, and $f_B \leq f_S/2$ is the constrained signal bandwidth; (c) converting the sampled signal to an optical sampled signal; (d) converting the optical sampled signal from a temporal signal to a spatial signal; (e) illuminating a smart pixel array with the spatial signal; (f) processing the spatial signal with an error diffusion neural network to produce a 2-D binary image; and (g) averaging rows and columns of the 2-D binary image using a digital low pass filter and a decimation circuit.

The present invention also provides an A/D converter comprising a filter for filtering an analog signal to the range $0 \leq f_x \leq f_B$; a sampler for sampling the filtered signal at a rate $f_S \gg f_N$, where $f_S$ is the sampling frequency, $f_N = 2f_x$ is the Nyquist frequency of the sampled signal, and $f_B \leq f_S/2$ is the constrained signal bandwidth, the sampler also converting the sampled signal to an optical sampled signal; a temporal-to-spatial converter for converting the optical sampled signal from a temporal signal to a spatial signal; a smart pixel array illuminated by the spatial signal; an error diffusion neural network for processing the spatial signal to produce a 2-D binary, image; a digital low pass filter; and a decimation circuit.

Another embodiment of the invention is a method of converting an analog signal to a digital signal comprising (a) filtering the analog signal to the range $0 \leq f_x \leq f_B$; (b) sampling the filtered signal at a rate $f_S \gg f_N$, where $f_S$ is the sampling frequency, $f_N = 2f_x$ is the Nyquist frequency of the sampled signal, and $f_B \leq f_S/2$ is the constrained signal bandwidth; (c) converting the sampled signal to an optical sampled signal; (d) converting the optical sampled signal from a temporal signal to a spatial signal; (e) illuminating a smart pixel array with the spatial signal: (f) processing the spatial signal with an error diffusion neural network to produce a series of 2-D binary images: and (g) averaging the series of 2-D binary images in x, y and z directions using a digital low pass filter and a decimation circuit.

The invention also encompasses an A/D converter comprising a filter for filtering an analog signal to the range $0 \leq f_x \leq f_B$; a sampler for sampling the filtered signal at a rate $f_S \gg f_N$, where $f_S$ is the sampling frequency, $F_N = 2f_x$ is the Nyquist frequency of the sampled signal, and $f_B \leq f_S/2$ is the constrained signal bandwidth, the sampler also converting the sampled signal to an optical sampled signal; a temporal-to-spatial converter for converting the optical sampled signal from a temporal signal to a spatial signal; a smart pixel array illuminated by the spatial signal; an error diffusion neural network for processing the spatial signal to produce a series of 2-D binary images; a digital low pass filter; and a decimation circuit.

Further objects, features and advantages of the invention will become apparent from the following detailed description taken in conjunction with the following drawing.

DETAILED DESCRIPTION OF THE PREFERRED EMBODIMENTS

The present invention uses a novel technique of optical space-time processing for A/D conversion. The invention involves the conversion of oversampled time-domain data into space-domain data using wide-bandwidth modulators or diffractive elements. The spatial signal is then processed in a fashion similar to image processing using digital halftoning and spatial error diffusion filtering.

Oversampling Techniques

Figure 1A:
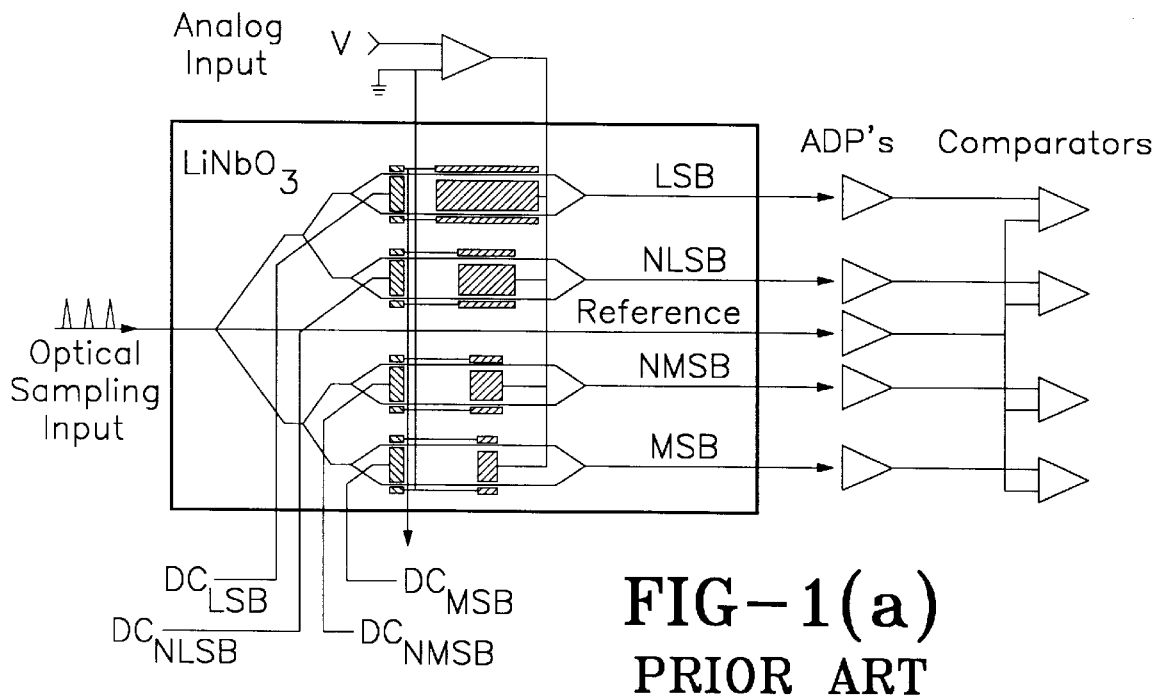
FIG. 1(a) is a schematic diagram of a 4-bit electroptic A/D converter.
Figure 1B:
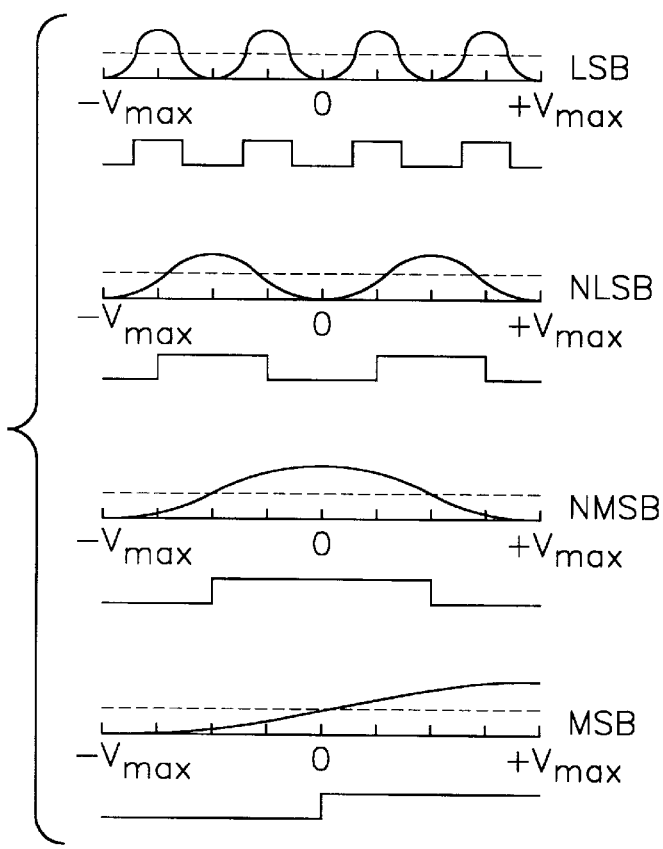
FIG. 1(b) shows the output intensity, threshold, and corresponding binary representation for each modulator in FIG. 1(a).
Figure 2:
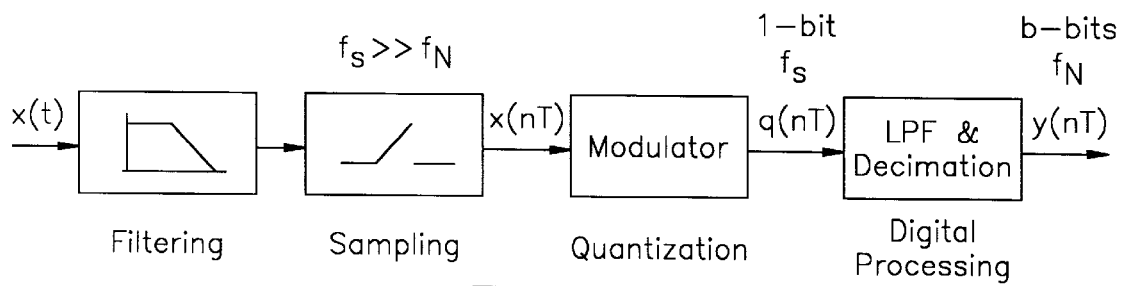
FIG. 2. is a generalized block diagram of an oversampled A/D converter.

Oversampled A/D conversion, most commonly referred to as $\Sigma\Delta$- or $\Delta\Sigma$-modulation, is an A/D technique which has become popular in the audio industry. This approach relies on a temporal form of error diffusion coding, whereby a large error associated with a single sample is diffused over many subsequent samples. Here, the error is generated by a low-resolution quantizer, and the diffusion is implemented by embedding the quantizer and a linear filter in a feedback architecture. FIG. 2 shows a generalized block diagram of an oversampled A/D converter. The analog signal x(t) is first bandlimited to the range $0 \leq f_x \leq f_B$ (Hz) and is then sampled at a rate $f_S \gg f_N$, where $f_S$ is the sampling frequency, $f_N = 2f_x$ is the Nyquist frequency of the sampled signal, and $f_B \leq f_S/2$ is the constrained signal bandwidth. The output of the sampler is then input to the modulator, which provides coarse amplitude quantization and spectral shaping of the quantization noise. The digital postprocessor, which consists of a digital low pass filter and decimation circuitry removes the quantization noise which was spectrally shaped by the modulator, provides anti-aliasing protection, and reduces the rate to the original sampled signal's Nyquist rate by trading word rate for word length.

Figure 3A:
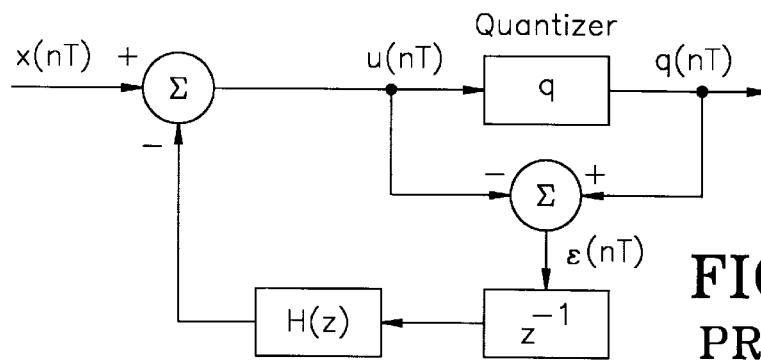
FIG. 3(a) is a block diagram of a recursive error diffusion modulator.
Figure 3B:
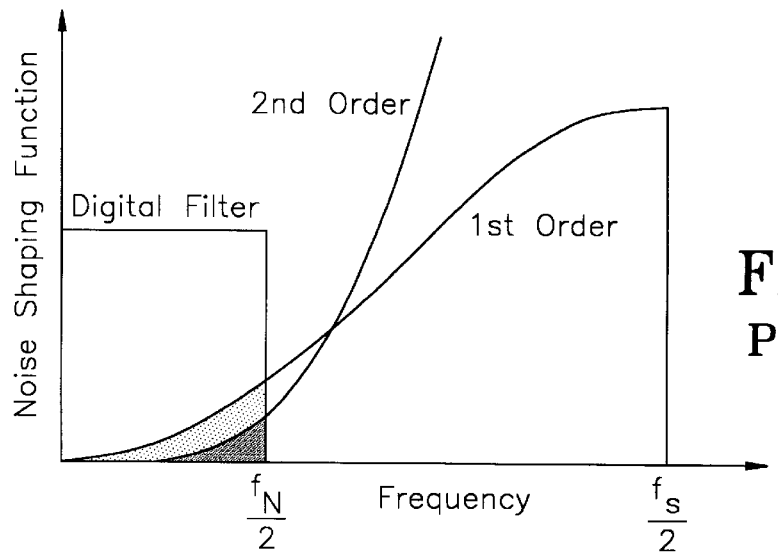
FIG. 3(b) shows the noise shaping characteristics for first- and second-order noise filters.

The modulator is the key element of this architecture whose function is to quantize the analog input signal and reduce the quantization noise within the signal baseband. For optical implementations, an alternative architecture to those typically associated with electronic implementations is used in order to reduce optical losses and prevent quantizer overload. Fixture 3(a) shows the block diagram of this specific realization called a recursive error diffusion modulator. Here, H(z) represents the Z-transform of a causal, unity gain filter, $z^{-1}$ is a unit sample delay, and q is a low-resolution quantizer. FIG. 3(b) shows the noise shaping characteristics for first and second order noise shaping filters where H(z)=1 and H(z)=1−2$z^{-1}$+$z^{-2}$, respectively.

The input to the modulator is assumed to be in the range $x_n \in [-b,b)$, where we use the usual definition of the half-open interval [a,b)={x: a≦x<b}. It can be shown that for H(z)=1 and assuming a uniform binary quantizer with digital output levels $$q(u_n) \in \left\{ +\frac{\Delta}{2}, -\frac{\Delta}{2} \right\},$$

the nonlinear difference equation describing this modulator is $$q(u_n) = \underbrace{x_n}_{\text{signal}} + \underbrace{\varepsilon_n - \varepsilon_{n-1}}_{\text{quantization error}} \quad (2)$$

Figure 4A:
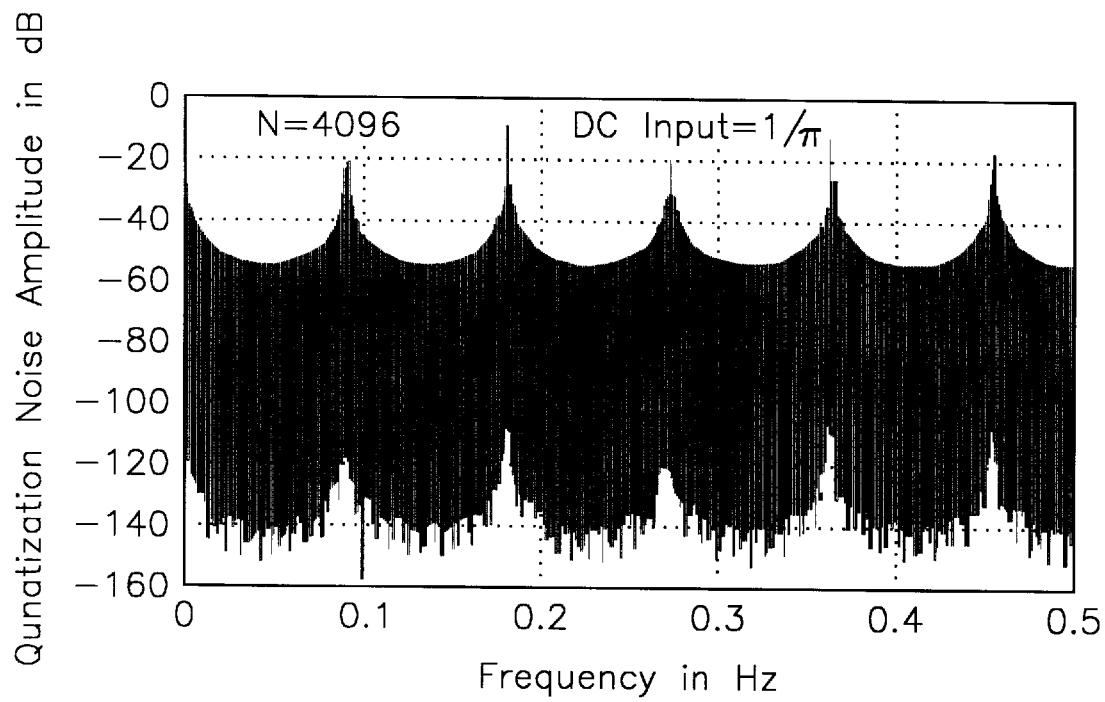
FIG. 4(a) shows the spectrum of a typical first-order modulator and FIG. 4(b) shows the spectrum of a typical second-order modulator.
Figure 4B:
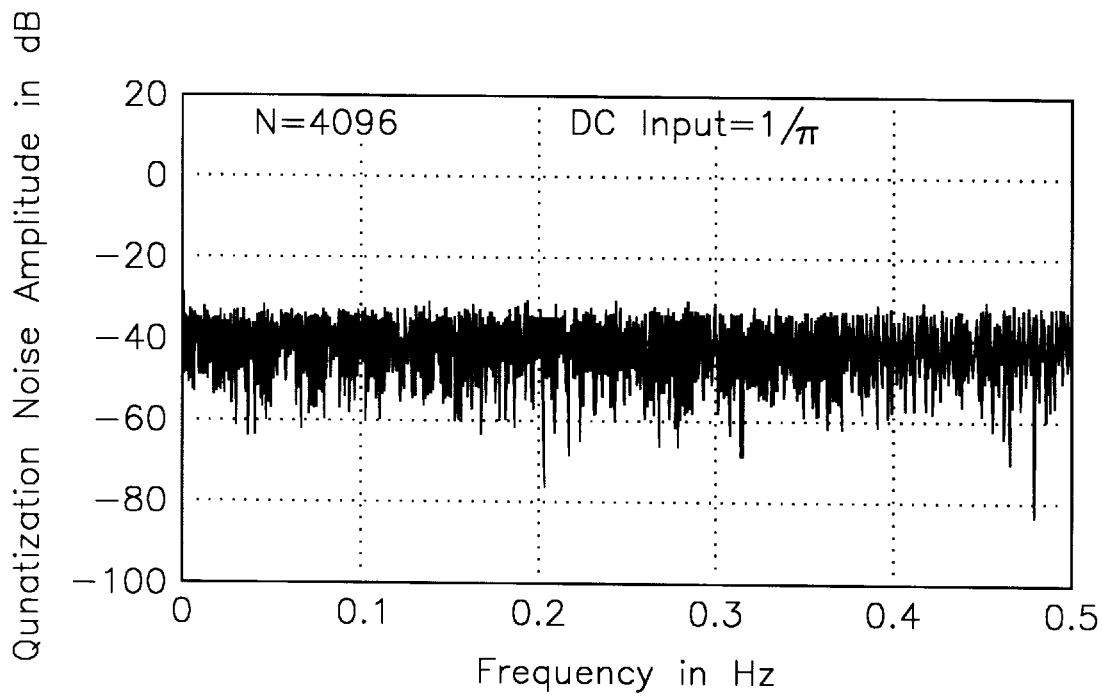

Here the quantity $\epsilon_n$ is the quantization error that would be seen at the modulator output if there were no feedback loop. As a result of the negative feedback, the first-order difference of the error, $\epsilon_n - \epsilon_{n-1}$, appears at the output instead. By design, this difference signal is concentrated at high frequencies and can therefore be removed by the digital low pass filter in the postprocessor. If the quantization noise is uncorrelated with the input signal and has statistical moments consistent with a uniform white process, we refer to this process as noise shaping, since only the quantization noise will be affected by the filtering operation. Previously, we have shown (See B. L. Shoop, Optical oversampled analog-to-digital conversion. Ph.D. Dissertation, Stanford University, June (1992) that a first-order error diffusion modulator does not provide these statistical moments but that a second-order modulator does, in fact, produce statistical moments consistent with a white noise process. FIG. 4(a) shows the non-white spectrum of a typical first-order modulator, where the discrete spectral peaks occur at frequencies which are dependent on the signal amplitude. FIG. 4(b) shows the spectrum of a typical second-order modulator which does exhibit white noise characteristics.

System Performance

A convenient measure by which to compare an A/D converter's performance is the maximum signal-to-quantization noise ratio $SQNR_{max}$ which is defined as the ratio of the output power at the frequency of a full-scale input sinusoid to the quantization noise power within the signal baseband. In the case of an oversampled A/D converter, analytic evaluation of this expression requires knowledge of the quantizer error spectrum and the postprocessor filter transfer function. If we assume white quantization noise characteristics and an ideal low pass filter with cutoff frequency $f_B$, the $SQNR_{Max}$ for an $N^{th}$-order modulator with a full-scale input range of ±Δ/2 can be shown to be $$SQNR_{\max}(M, N) = \frac{3}{2} \cdot \left[ \frac{2N+1}{\pi^{2N}} \right] \cdot M^{2N+1}, \quad (3)$$

where $M = f_S/f_N$ is defined as the oversampling ratio. A conventional uniform Nyquist rate quantizer with b-bits resolution can be shown to provide a $SQNR_{max}(b) = 3 \cdot 2^{2b-1}$.

Figure 5:
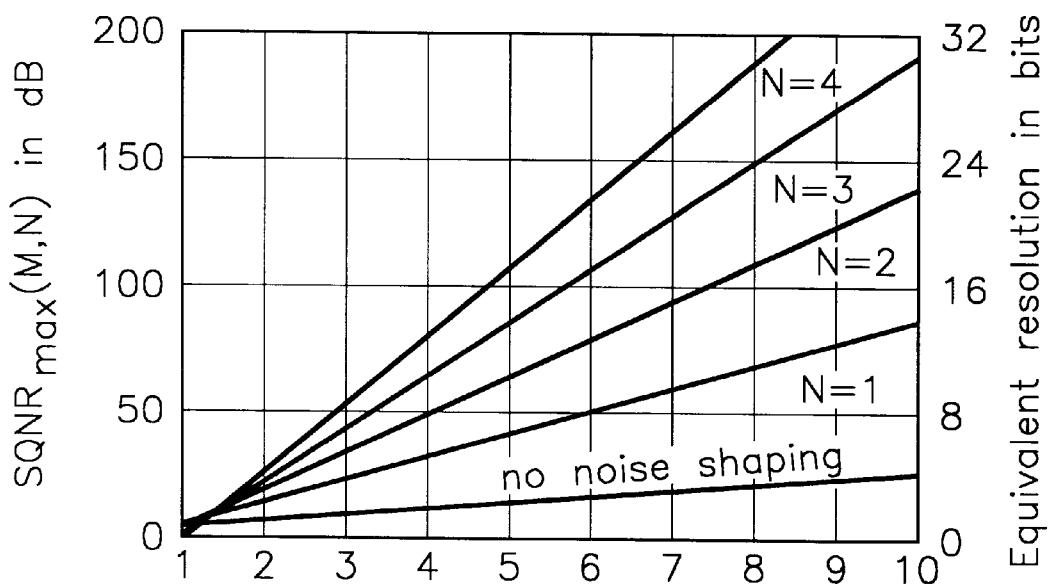
FIG. 5 shows the theoretical maximum signal-to-quantization noise ratio of $N^{th}$-order modulators.

FIG. 5 shows the theoretical $SQNR_{max}(M,N)$ and equivalent resolution for first- through fourth-order oversampled modulators as a function of oversampling ratio. Results for N=1 are also included because, although the additive noise model does not predict the spectral characteristics of the quantization noise, it does yield accurate results for the $SQNR_{max}$. The case of no noise shaping represents the $SQNR_{max}$ that can be expected if the same quantizer, embedded in the feedback loop of the oversampled modulator, were simply oversampled and digitally filtered. The slope of this curve is 3dB per octave while those of the N=1 and N=2 curves are 9 dB and 15 dB, respectively, showing the significant advantage achieved by using a noise shaping modulator.

We have previously investigated an optical implementation of an oversampled A/D architecture and experimentally demonstrated a first-order noninterferometric oversampled modulator using multiple quantum well modulators (See B. L. Shoop and J. W. Goodman, "A first-order error diffusion modulator for optical oversampled A/D conversion," Optics Comm. 97, 167–172 (1993)). This investigation showed that a two-stage optical oversampled A/D converter based on MQW devices should be capable of providing 8 and 16 bits resolution at a Nyquist rate of 1 Gbps and 100 kbps, respectively.

Digital Image Halftoning

Figure 6:
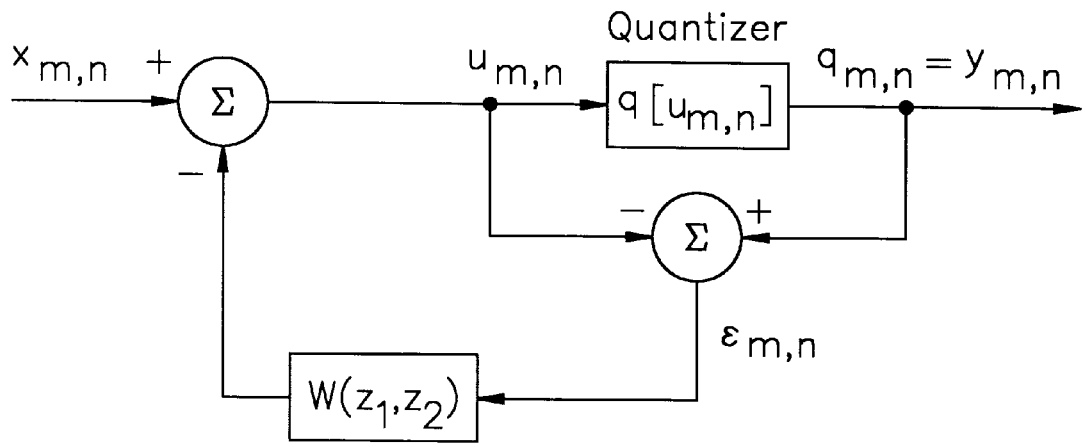
FIG. 6 is a block diagram of a 2-D recursive error diffusion architecture.

Digital image halftoning is an important class of A/D converter which can be considered the spatial counterpart of temporal oversampled A/D conversion. In digital halftoning, a continuous-tone input image is first spatially oversampled to produce an image with many more pixels than that required by the Nyquist criterion. This oversampled image is then processed to produce an output image which is strictly bilevel. The choice of the binary output values is judiciously chosen such that the resulting halftoned image creates the illusion of a continuous-tone image. To improve the halftone image quality, a method of quantization is used in which the error associated with the nonlinear quantization process is diffused within a local region and subsequent filtering techniques employed in an effort to improve some performance metric such as signal-to-noise ratio. FIG. 6 shows a block diagram of a typical halftoning process using this error diffusion algorithm. It is clear that this block diagram is the spatial equivalent of the temporal error diffusion architecture of FIG. 3(a).

We are currently investigating an optoelectronic implementation of the error diffusion neural network using smart pixel technology. Smart pixel technology integrates optoelectronic devices for the input and output functionality with electronic circuitry for the processing functionality. A smart pixel hardware implementation of the error diffusion neural network provides the potential to simultaneously leverage the computational complexity of electronic circuitry and the parallelism and high-speed switching of optics. The goal of this portion of our research program is to produce a fast, massively parallel hardware implementation of the error diffusion algorithm which provides the capability of producing high-quality, real-time halftoned images.

Recently, we have investigated several different approaches to the smart pixel implementation of the error diffusion neural network. These included epitaxial lift-off (ELO) (See B. L. Shoop, A. H. Sayles, and D. M. Litynski. "New devices for optoelectronics: smart pixels," Chapter 20 in Handbook of Fiber Optic Data Communications, C. DeCusatis, D. Clement. E. Maass, and R. Lasky, Ed., Academic Press, San Diego. Calif., 705–758 (1997)) employing resonant cavity enhanced (RCE) LEDs on silicon very large scale integration (VLSI) circuitry, epitaxy-on-electronics integrating InGaP LEDs with GaAs circuitry (See D. A. Hall, B. L. Shoop, J. R. Loy, G. B. Tait, E. K. Ressler, J. F. Ahadian, and C. G. Fonstad, "Experimental demonstration of a 3×3 monolithically integrated smart pixel neural array based on epitaxy-on-electronics technology," Postdeadline Paper in OSA Annual Meeting Technical Digest, (Long Beach, Calif.) (1997)), self electrooptic effect device (SLED) multiple quantum well (MQW) modulators flip-chip bonded to silicon VLSI circuitry (See B. L. Shoop, A. H. Sayles, D. A. Hall, and E. K. Ressler, "A smart pixel implementation of an error diffusion neural network for digital halftoning," Invited Paper in Special Issue of the International Journal of Optoelectronics on Smart Pixels, 11, 217–228 (1997)), and both analog (See D. A. Hall, B. L. Shoop, R. W. Sadowski, A. H. Sayles. G. P. Dudevoir, D. M. Litynski, and P. K. Das, "Experimental results from a smart pixel implementation of the wavelet transformation for signal processing." Proc. SPIE 3391, 168–178 (1998)) and digital versions of liquid crystal on silicon (LCOS). In a parallel effort within our research program, diffractive optical weighting and interconnections have recently been designed and experimentally characterized for a future smart pixel architecture (See G. R. Kilby, B. L. Shoop, and J. N. Mait, "Performance of diffractive elements for use in optoelectronic analog-to-digital conversion," OSA Annual Meeting Technical Digest, (Long Beach, Calif.) (1997)).

Photonic Oversampled A/D Converter Based On Space-Time Processing

Figure 7:
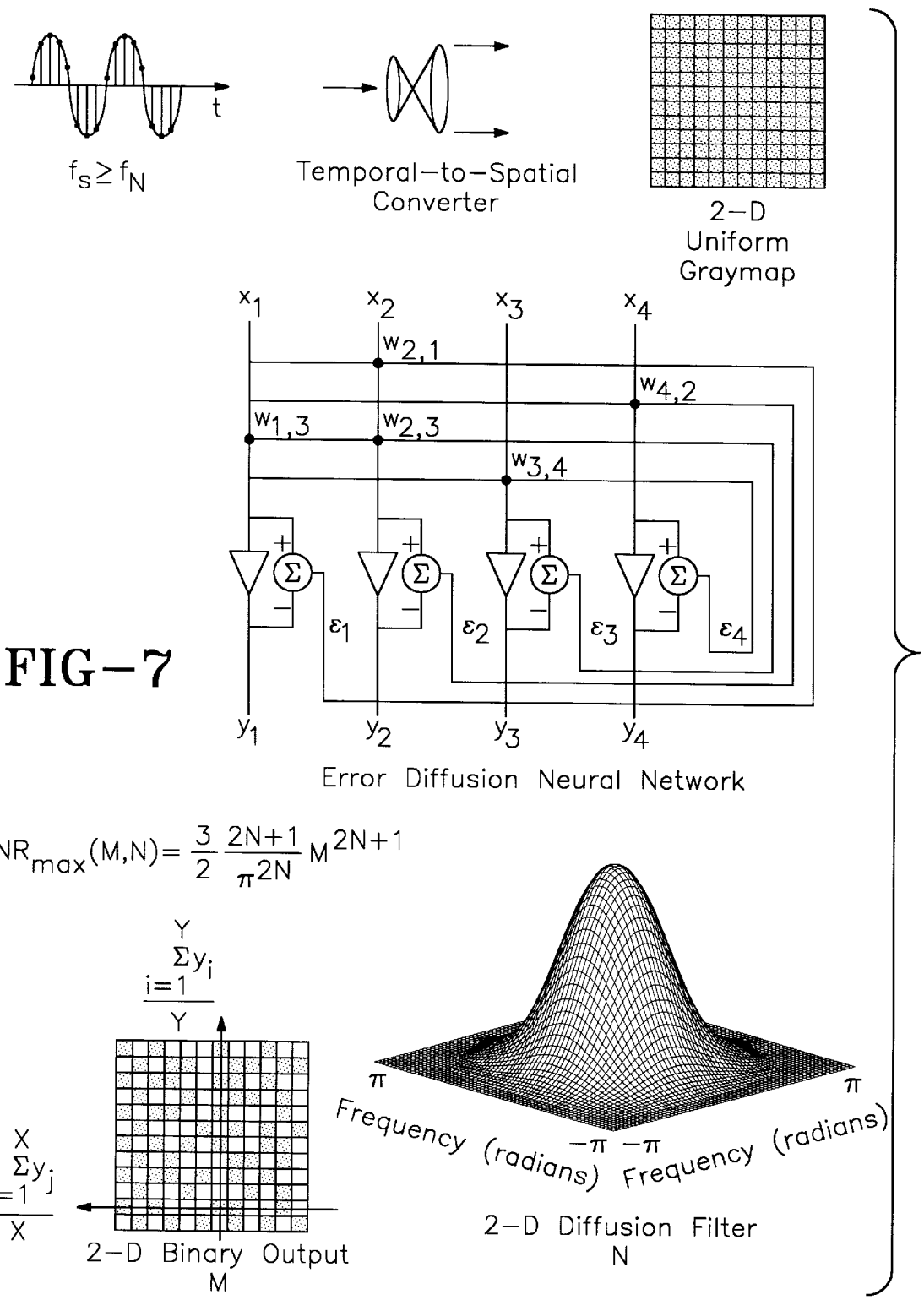
FIG. 7 diagrammatically shows a high-resolution photonic-based A/D converter method using 2-D space-time processing.
Figure 8:
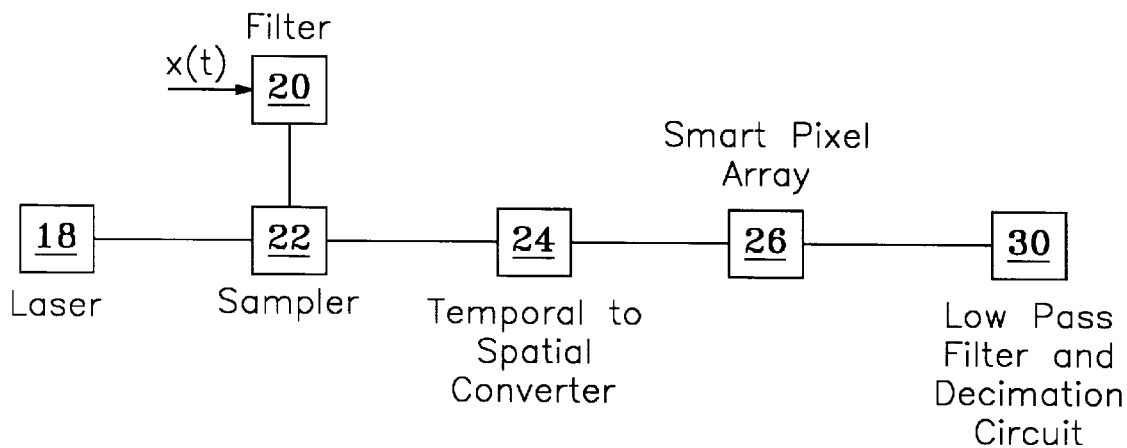
FIG. 8 is a block diagram of a high-resolution photonic-based A/D converter for implementing the method of FIG. 7.

FIG. 7 diagrammatically shows a high-resolution photonic-based A/D converter method using 2-D space-time processing (See B. L. Shoop, "Photonic analog-to-digital converters," Invited Paper in Optics in Computing '98, P. Chavel, D. A. B. Miller, H. Thienpont, Ed. Proc. SPIE 3490, 252–255 (1998), which is hereby expressly incorporated by reference). In FIG. 7, the sequence of steps is clockwise beginning in the upper left corner. FIG. 8 is a block diagram of a high-resolution photonic-based A/D converter for implementing the method of FIG. 7.

Although not shown in FIG. 7, the analog signal x(t) is first bandlimited to the range $0 \leq f_x \leq f_B$ (Hz) by filter 20. The input time signal is then sampled by sampler 22 at a rate $f_S \gg f_N$, where A is the sampling frequency, $f_N = 2f^x$ is the Nyquist frequency of the sampled signal, and $f_B \leq f_S/2$ is the constrained signal bandwidth. Sampler 22 is an optoelectronic device which simultaneously samples the electronic analog signal and converts the sampled signal to an optical sampled signal. Sampler 22 may be, for example, a high-speed Mach-Zehnder interferometer which is routinely used to provide high-speed optical sampling at rates in excess of 60 GHz. Recent developments in polymer Mach-Zehnder interferometers have demonstrated sampling rates in excess of 120 GHz. Sampler 22 may also be an acoustooptic modulator. Sampler 22 uses the time signal to modulate the intensity of a laser 18.

The output of sampler 22 is expanded and collimated by temporal-to-spatial converter 24 to convert the time signal to a 2-D image. In its simplest form, temporal-to-spatial converter 24 is a series of two lenses that basically expands the optical input signal to cover a two-dimensional array. Depending on the specific configuration, the beam can be expanded uniformly in two-dimensions or the beam can be expanded in a one-dimensional linear array. Temporal-to-spatial converter 24 may also be a beam deflector and an acoustooptic modulator externally modulated to scan the input optical sample across the two-dimensional array.

The output of the temporal-to-spatial converter 24 illuminates an N×N pixel smart pixel array 26. Typical values of N are in the range of 512 or 1024 elements. Using the parallelism of optics in this way, we have effectively converted the sampling rate from $f_S$ to $N^2 f_S$ which is a factor of $10^6$ for $N=10^3$. The output of the N×N pixel image associated with the single time sample is then processed by an error diffusion neural network in a similar fashion to the above-discussed digital image halftoning process.

The smart pixel array 26 includes an error diffusion neural network. The smart pixel array 26 encompasses the gray-scale input, processing functionality to include a two-dimensional diffusion filter, and a two-dimensional binary output. Smart pixel technology integrates optoelectronics devices with electronic circuitry. Typically, the optoelectronic devices are integrated onto VLSI CMOS silicon circuitry using, techniques such as flip-chip bonding. In the present invention, silicon photodetectors are integrated with the VLSI CMOS silicon circuitry during the initial growth stage. Other optoelectronic devices such as light emitting diodes (LEDs), laser diodes, or multiple quantum well (MQW) modulators are flip-chip bonded to the silicon VLSI circuitry in a post-processing step. The silicon VLSI CMOS circuitry was fabricated in a 0.5 um linewidth process with a 10×10 array of MQW modulators flip-chip bonded to the silicon substrate.

The photodetectors detect the two-dimensional uniform gray-scale intensity, converting this input signal to an electronic photocurrent which is subsequently provided to the CMOS VLSI electronic circuitry which provides the functionality for the error diffusion neural network. The MQW modulators then provide a binary optical output signal which can then be detected and processed using digital electronic circuitry. The binary output is also available electronically and can be processed directly by the digital postprocessing circuitry 30. The digital postprocessing, circuitry 30 comprises a digital low pass filter and decimation circuitry.

The output of the halftoning process is a 2-D binary image as shown in FIG. 7. The rows and columns of the 2-D binary image are then averaged using a digital low pass filter and decimation circuitry 30. The digital low pass filter and decimation circuitry 30 removes the quantization noise spectrally shaped by the modulator, provides anti-aliasing protection and reduces the rate to the original sampled signal's Nyquist rate by trading word rate for word length.

Figure 10:
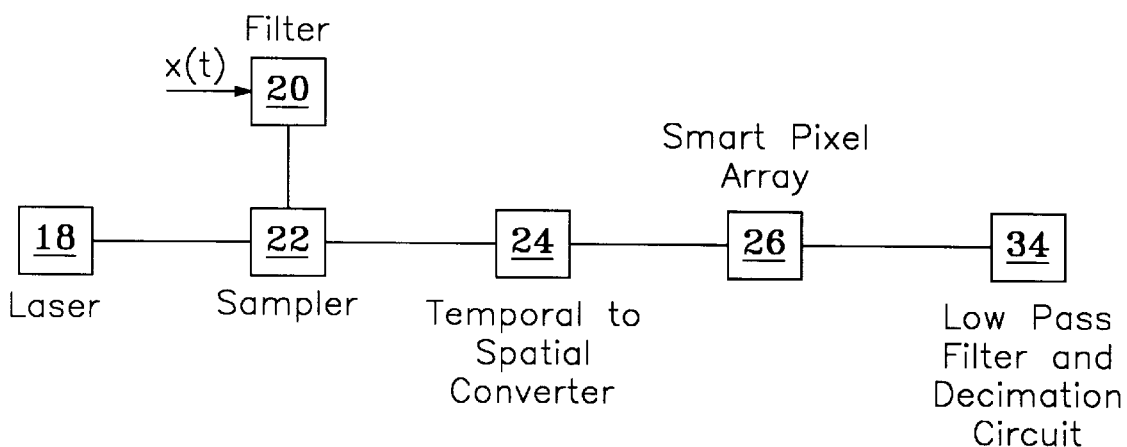
FIG. 10 is a block diagram of a high-resolution photonic-based A/D converter for implementing the method of FIG. 9.
Figure 9:
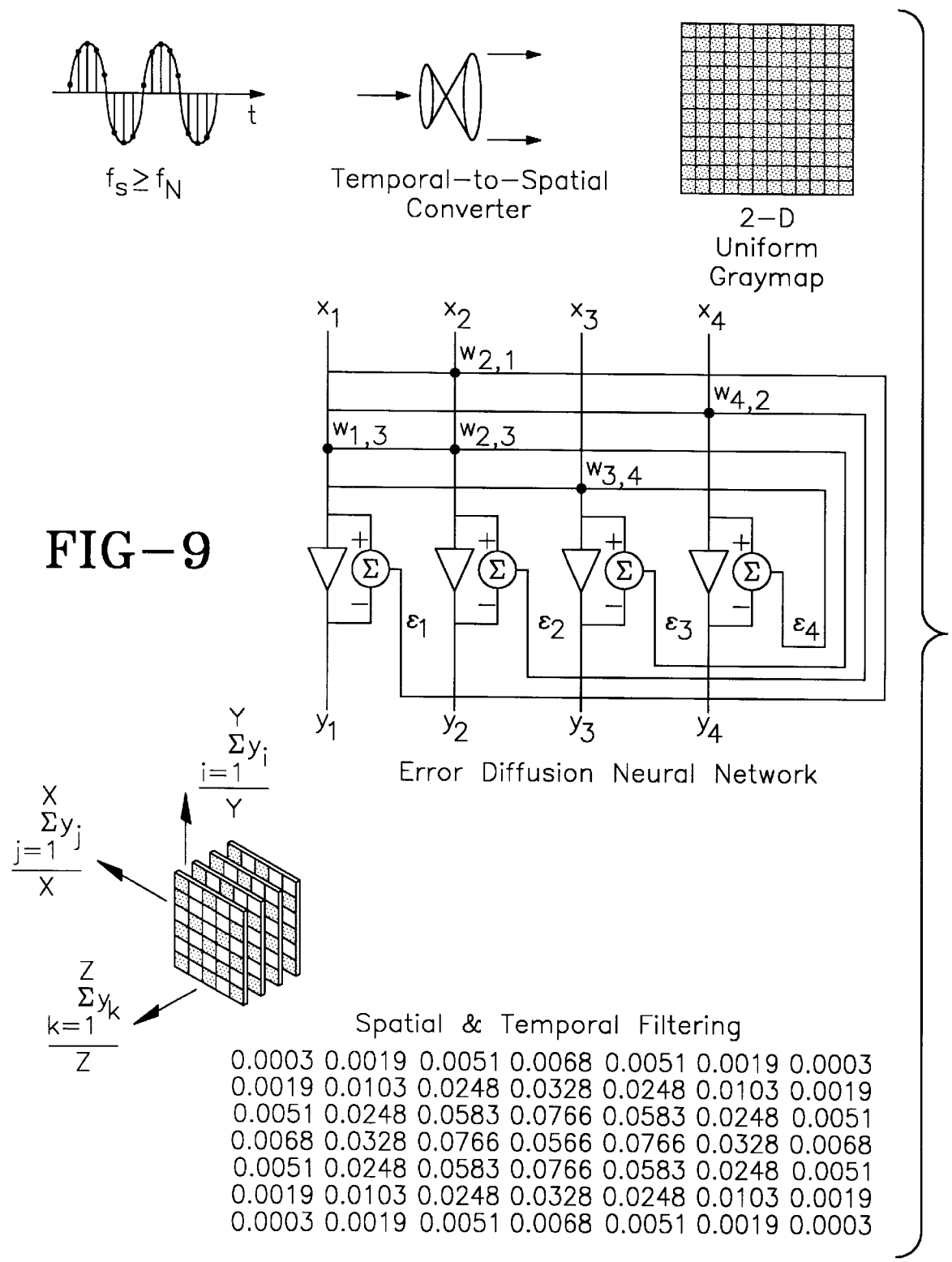
FIG. 9 diagrammatically shows a high-resolution photonic-based A/D converter method using 3-D space-time processing.

Using this spatial-temporal approach, the effective oversampling ratio of the converter can effectively be improved resulting in an increase in the converter resolution. The concepts of spatial postprocessing can also be extended to include temporal processing in a 3-D architecture. FIG. 9 diagrammatically shows a high-resolution photonic-based A/D converter method using 3-D space-time processing. FIG. 10 is a block diagram of a high-resolution photonic-based A/D converter for implementing the method of FIG. 9.

Referring now to FIGS. 9 and 10, the method and apparatus using 3-D space-time processing is similar to that using 2-D space-time processing. The difference is that the error diffusion includes the third dimension of time. Thus, the diffusion filter in the error diffusion neural network includes the central coefficient. Additionally, the output of the halftoning process is a series of 2-D binary images as shown in FIG. 9. The series of 2-D binary images are averaged in the x, y and z directions using a digital low pass filter and decimation circuitry 34.

Figure 11:
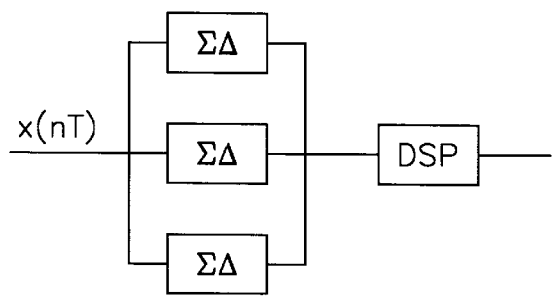
FIG. 11 is a schematic of a parallel oversampling architecture.

The analysis of a classic oversampling A/D converter shows that we can expect 6N dB improvement in SNR for each doubling of the oversampling ratio, M. This corresponds to N+½ bits improvement in the effective number of bits resolution for each doubling of M. Similarly, if we parallelize the architecture, similar to that shown in FIG. 11, we can achieve 3 dB improvement in SNR for each doubling of the number of channels, N, which equates to an increase of+½ bit in the effective number of bits for each doubling of N.

Figure 12:
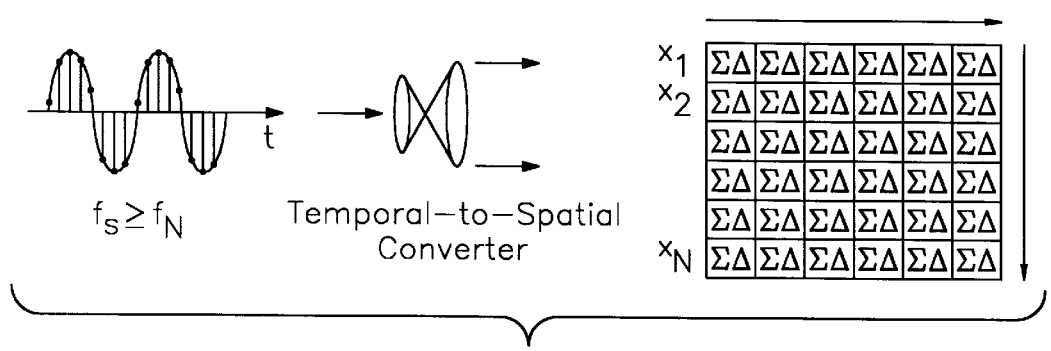
FIG. 12 diagrammatically shows a 2-D parallelized smart pixel oversampling architecture.

Using this concept and the 2D nature of the smart pixel architecture, we can extend this concept to that shown in FIG. 12. Here, the input electronic signal is first sampled at a rate much higher than that required by the Nyquist criterion and is then presented to a parallel smart pixel implementation where each individual pixel contains the necessary functionality to implement an oversampling modulator. In this architecture, there exist many different possibilities for error diffusion. In one, the error diffusion can be implemented within each individual row only. Here each individual time sample is presented to the entire row for processing. Upon completion of the postprocessing function, the high-resolution multi-bit digital word is available on a row-by-row basis. In a second implementation, each time sample is presented to the entire 2D array of $\Sigma\Delta$ modulators and the postprocessing is accomplished using the output from all N×N pixels. The flexibility of this particular architecture allows for many different error diffusion possibilities, each providing different converter resolutions.

Performance

In our analysis, we have extended previously developed Nyquist-rate performance bounds to the case of oversampling A/D converters. We have found that in oversampling converters, the thermal noise is reduced by the oversampling ratio, M, the quantizer noise, comparator hysteresis, and in a specific configuration, sampling jitter, are all reduced by a factor proportional to $M^{2N+1}$) In the following, we develop these performance bounds.

Thermal Noise Bound. Thermal noise reduces the overall dynamic performance of an A/D converter in much the same way it does in any other system. The thermal noise power contribution to the converter performance will be that thermal noise present at the input to the system reduced by M, since the postprocessing filter removes any noise above the baseband frequency $S_{thermal}$ where $$S_{thermal} = \frac{3kT f_B R_{eff}}{2M},$$

where k is Boltzman's constant, T is the absolute temperature, $R_{eff}$ is the equivalent thermal noise resistance, and $f_B$ is the constrained signal bandwidth. Since SNR(dB)= 6.02b+1.76 for a full-scale sinusoidal input, the SNR resulting from thermal noise contributions is $$SNR_{thermal} = \frac{M}{3kT f_B R_{eff}},$$

resulting in an upper-bound on the effective number of bits resolution of $$b_{eff} = \frac{1}{2}\log_2\left(\frac{M}{3kT f_B R_{eff}}\right) - 0.292.$$

The oversampling A/D converter provides an improvement in thermal noise performance proportional to the oversampling ratio, yielding an increase of ½-bit for every doubling of the oversampling ratio.

Quantizer Noise Bound. In the case of an oversampling A/D converter, analytic evaluation of the SNR requires knowledge of the quantizer error spectrum and the postprocessor filter transfer function. Bennett has shown that the quantizer noise power for a uniform quantizer is $S_q(f)=\Delta^2/12$. The resulting quantizer noise power contribution within the baseband B for an $N^{th}$-order modulator is $$S_{qB} = \int_{-\frac{f_B}{2}}^{\frac{f_B}{2}} S_\varepsilon(f)df \approx \frac{\pi^{2N}}{2N+1}\cdot\left(\frac{f_N}{f_S}\right)^{2N+1}\cdot S_q(f).$$

For a full-scale input range of $\pm\Delta/2$ the SNR can be shown to be $$SNR_q(M, N) = \frac{3}{2}\cdot\frac{2N+1}{\pi^{2N}}\cdot\left(\frac{f_s}{f_M}\right)^{2N+1} = \frac{3}{2}\cdot\frac{2N+1}{\pi^{2N}}\cdot M^{2N+1},$$

and the effective number of bits resolution is $$b_{eff} = \log_2\left[\frac{\sqrt{2N+1}}{\pi^{2N}}\cdot M^{(N+\frac{1}{2})}\right].$$

When considering quantizer noise, the oversampling A/D converter effectively provides an additional N+1/2 bits of resolution for every doubling of the oversampling ratio.

Sampling Jitter Bound. Sampling jitter in an A/D converter results in nonuniform sampling of the input signal which subsequently results in an additional error contribution thereby increasing the total error power in the quantizer output. The magnitude of this error is a function of both the statistical properties of the sampling jitter and the input signal itself. In an oversampled A/D converter, there are two distinctly different approaches to accomplishing signal sampling: explicit sampling and integral sampling. Explicit sampling is defined here as an explicit sampling operation subsequent to the anti-alias filtering operation. Integral sampling describes the sampling function when performed by the quantizer or within the oversampling modulator. Integrated sampling simplifies the overall A/D converter architecture by eliminating the need for separate sampling circuitry and, as will be shown shortly, reduces the impact of sampling jitter on the overall performance of the oversampling A/D converter.

Explicit Sampling. The error resulting from sampling a sinusoidal signal with amplitude A and frequency $f_x$ at an instant which is in error by an amount $\delta$ can be described by $x(t+\delta)-x(t)\approx 2\pi f_x \delta A \cos(2\pi f_x t)$.

Under the assumption that the sampling uncertainty is an uncorrelated Gaussian random process with standard deviation $\tau_j$, the power in this error signal is $$S_j = \frac{A^2}{2}(2\pi f_x \tau_j)^2.$$

As was the case with thermal noise, the decimation filter in the postprocessor removes the contributions from the error spectrum above the frequency of the baseband signal. Since the clock jitter is assumed to be uniformly distributed, the total power of this error is reduced by the oversampling ratio M through the decimation process. Therefore, the inband error power $S_{jB}$ can be analytically described by $$S_{jB} = \frac{\Delta^2}{8} \frac{(2\pi f_x \tau_j)^2}{M}.$$

The SNR performance resulting from explicit sampling jitter is $$SNR_{jitter}(\text{dB}) = 10 \log_{10}\left[\frac{M}{(2\pi f_x \tau_j)^2}\right],$$

corresponding to $$b_{eff} = \frac{1}{2} \log_2\left[\frac{M}{(2\pi f_x \tau_j)^2} \cdot\right] - 0.292$$

effective number of bits resolution. As with thermal noise, an increase of ½-bit resolution for every doubling of the oversampling ratio results for explicit sampling jitter performance.

Integral Sampling. If the sampling is performed instead as an integral part of the oversampled modulator, the impact from sampling uncertainty is fundamentally different. In this case, the sampling occurs as part of the quantization process and therefore, the noise shaping characteristics of the modulator modify the spectral contribution of the sampling jitter error in much the same way the modulator spectrally shapes the quantization noise. The sampling jitter noise power previously described is now spectrally-shaped by the filter in the feedback loop of the modulator and subsequently removed by the decimation filter in the postprocessor. Therefore, the inband noise contribution from integral sampling is $$S_{jB} \approx \frac{\pi^{2N}}{2N+1} \cdot \left(\frac{f_N}{f_S}\right)^{2N+1} \cdot S_j(f).$$

The SNR resulting from integral sampling jitter is $$SNR_{jitter} = \frac{(2N+1) \cdot M^{(2N+1)}}{\pi^{2N}} \cdot \frac{1}{(2\pi f_x \tau_j)^2},$$

which results in $$b_{eff} = \log_2\left[\frac{\sqrt{2N+1} \cdot M^{(N+\frac{1}{2})}}{\pi^N}\right] + \log_2\left[\frac{1}{(2\pi f_x \tau_j)^2} \cdot\right] - 0.292$$

effective number of bits. For an oversampling ratio of $M=10^3$ and a second-order error diffusion filter $N=2$, this analysis predicts an improvement of 22 bits over the sampling jitter performance for explicit sampling. The oversampling A/D converter is therefore insensitive to sampling jitter resulting from integral sampling.

Quantizer Hysteresis. Hysteresis is a common source of error in comparators used for quantization. The hysteresis error is modeled as an additive white noise source with power $S_h=(h\Delta/2)^2$, where h is the magnitude of the quantizer hysteresis relative to the quantizer step size $\Delta$. This noise undergoes the same spectral noise shaping as the quantization noise and the integral sampling jitter. As a result, the hysteresis noise contribution within the baseband is $$S_{hB} \approx \frac{\pi^{2N}}{2N+1} \cdot \left(\frac{f_N}{f_S}\right)^{2N+1} \cdot S_h(f).$$

The SNR resulting from quantizer hysteresis is $$SNR_h = \frac{2(2N+1) \cdot M^{(2N+1)}}{\pi^{2N}} \cdot \frac{1}{h^2},$$

and the corresponding number of bits resolution resulting is $$b_{eff} = \log_2\left[\frac{\sqrt{2(2N+1)} \cdot M^{(N+\frac{1}{2})}}{\pi^N}\right] + \log_2\left[\frac{1}{h^2} \cdot\right] - 0.292.$$

Since the hysteresis error contribution is within the modulator, it is suppressed by the noise shaping characteristic of the feedback loop.

Observations. While there are clearly other noise contributions to any practical A/D converter, the ones addressed here account for those which typically limit overall performance and therefore represent those noise contributions which necessarily require attention when attempting to extend performance. The performance bounds described here clearly demonstrate the advantage of oversampling A/D converters. Significant in these findings is that if the sampling is done as an integral part of the oversampling modulator and the sampling rate is sufficiently high, the sampling jitter, quantization noise, and hysteresis will not be the limiting factors in overall performance. These results are particularly important for photonic implementations which can provide very high-speed sampling and consequently high oversampling ratios.

While the invention has been described with reference to certain preferred embodiments, numerous changes, alterations and modifications to the described embodiments are possible without departing from the spirit and scope of the invention as defined in the appended claims, and equivalents thereof.

What is claimed is:

1. A method of converting an analog signal to a digital signal, comprising:

(a) filtering the analog signal to the range $0 \leq f_x \leq f_B$;

(b) sampling the filtered signal at a rate $f_S \gg f_N$, where $f_S$ is the sampling frequency, $f_N = 2f_x$ is the Nyquist frequency of the sampled signal, and $f_B \leq f_S/2$ is the constrained signal bandwidth:

(c) converting the sampled signal to an optical sampled signal;

(d) converting the optical sampled signal from a temporal signal to a spatial signal;

(e) illuminating a smart pixel array with the spatial signal;

(f) processing the spatial signal with an error diffusion neural network to produce a 2-D binary image; and (g) averaging rows and columns of the 2-D binary image using a digital low pass filter and a decimation circuit.

2. The method of claim 1 wherein steps (b) and (c) are performed using a Mach-Zehnder interferometer.

3. The method of claim 1 wherein steps (b) and (c) are performed using an acoustooptic modulator.

4. The method of claim 1 wherein step (d) is performed using a series of two lenses.

5. The method of claim 1 wherein step (d) is performed using a beam deflector and an acoustooptic modulator.

6. The method of claim 1 wherein in step (e) the smart pixel array includes an N×N pixel smart pixel array and wherein N is one of 512 and 1024.

7. An A/D converter, comprising:

a filter for filtering an analog signal to the range $0 \leq f_x \leq f_B$;

a sampler for sampling the filtered signal at a rate $f_S \gg f_N$, where $f_S$ is the sampling frequency, $f_N = 2f_x$ is the Nyquist frequency of the sampled signal, and $f_B \leq f_S/2$ is the constrained signal bandwidth, the sampler also converting the sampled signal to an optical sampled signal:

a temporal-to-spatial converter for converting the optical sampled signal from a temporal signal to a spatial signal;

a smart pixel array illuminated by the spatial signal;

an error diffusion neural network for processing the spatial signal to produce a 2-D binary image;

a digital low pass filter; and a decimation circuit.

8. The A/D converter of claim 7 wherein the sampler comprises a Mach-Zehnder interferometer.

9. The A/D converter of claim 7 wherein the sampler comprises an acoustooptic modulator.

10. The A/D converter of claim 7 wherein the temporal-to-spatial converter comprises a series of two lenses.

11. The A/D converter of claim 7 wherein the temporal-to-spatial converter comprises a beam deflector and an acoustooptic modulator.

12. The A/D converter of claim 7 wherein the smart pixel array includes an N×N pixel smart pixel array and wherein N is one of 512 and 1024.

13. A method of converting an analog signal to a digital signal, comprising:

(a) filtering the analog signal to the range $0 \leq f_x \leq f_B$;

(b) sampling the filtered signal at a rate $f_S \gg f_N$, where $f_S$ is the sampling frequency, $f_N = 2f_x$ is the Nyquist frequency of the sampled signal, and $f_B \leq f_S/2$ is the constrained signal bandwidth;

(c) converting the sampled signal to an optical sampled signal;

(d) converting the optical sampled signal from a temporal signal to a spatial signal;

(e) illuminating a smart pixel array with the spatial signal;

(f) processing the spatial signal with an error diffusion neural network to produce a series of 2-D) binary images; and (g) averaging the series of 2-D binary images in x, y and z directions using a digital low pass filter and a decimation circuit.

14. An A/D converter, comprising:

a filter for filtering an analog signal to the range $0 \leq f_x \leq f_B$;

a sampler for sampling the filtered signal at a rate $f_S \gg f_N$, where $f_S$ is the sampling frequency, $f_x = 2f_x$ is the Nyquist frequency of the sampled signal, and $f_B \leq f_S/2$ is the constrained signal bandwidth, the sampler also converting the sampled signal to an optical sampled signal;

a temporal-to-spatial converter for converting the optical sampled signal from a temporal signal to a spatial signal:

a smart pixel array illuminated by the spatial signal;

an error diffusion neural network for processing the spatial signal to produce a series of 2-D binary images;

a digital low pass filter; and a decimation circuit.

* * * * *